United States Patent
Anagnost

[19]

[11] Patent Number: 5,684,719
[45] Date of Patent: Nov. 4, 1997

[54] SOFTWARE-BASED RESOLVER-TO-DIGITAL CONVERTER

[75] Inventor: John J. Anagnost, Torrance, Calif.

[73] Assignee: Hughes Electronics, Los Angeles, Calif.

[21] Appl. No.: 472,571

[22] Filed: Jun. 7, 1995

[51] Int. Cl.⁶ .................................................. H03M 1/48
[52] U.S. Cl. .......................... 364/559; 364/453; 364/572; 364/574; 341/112; 341/115; 341/116; 318/661
[58] Field of Search .............................. 364/559, 572, 364/574, 453; 341/112, 115, 116; 318/661; 33/534

[56] References Cited

U.S. PATENT DOCUMENTS

| | | | |
|---|---|---|---|
| 4,099,245 | 7/1978 | Maysonett | 364/603 |
| 4,123,134 | 10/1978 | Meyers | 350/6.7 |
| 4,227,077 | 10/1980 | Hopson et al. | 250/203 R |
| 4,933,674 | 6/1990 | Gasperi et al. | 341/116 |
| 4,987,684 | 1/1991 | Andreas et al. | 33/304 |
| 4,989,001 | 1/1991 | Serev | 341/116 |
| 5,124,938 | 6/1992 | Algrain | 364/566 |
| 5,134,397 | 7/1992 | Eyerly et al. | 341/116 |
| 5,162,798 | 11/1992 | Yundt | 341/116 |
| 5,305,241 | 4/1994 | Hayashi et al. | 364/576 |
| 5,455,498 | 10/1995 | Kakimoto et al. | 318/605 |

FOREIGN PATENT DOCUMENTS

| | | |
|---|---|---|
| A 0 399 180 | 3/1990 | European Pat. Off. . |
| A 0 458 148 | 5/1991 | European Pat. Off. . |
| A 0 527 305 | 6/1992 | European Pat. Off. . |
| WO 93/16354 | 8/1993 | WIPO . |

*Primary Examiner*—Emanuel T. Voeltz
*Assistant Examiner*—Hien Vo
*Attorney, Agent, or Firm*—Georgann S. Grunebach; Michael W. Sales; Wanda K. Denson-Low

[57] ABSTRACT

A software-based resolver-to-digital converter (RDC) (80) for computing an angle of rotation Θ of gimbal-mounted instrumentation (16) in a gimbal system. The RDC (80) computes the angle of rotation of the instrumentation using parameter signals received from a resolver (32) in the system. The parameter signals, along with a resolver reference signal are input into a multiplexor (60) and are multiplexed. The signals are then fed to an analog to digital converter (38) and converted to digital form. The digital signals are then input into a processor (36) associated with the system. This processor, in addition to performing numerous system computations, is programmed through appropriate software to filter the digital signals received, compute the value for the angle of rotation Θ and output the computed value to system circuitry (31) for processing to enhance system operation. The present invention eliminates the need for additional resolver-to-digital converter hardware components (40, 42, 44), as the converter (80) is implemented at the existing system processor (36). The present invention thus reduces the system cost and circuit board space needed for system implementation.

16 Claims, 5 Drawing Sheets

SOFTWARE-BASED RESOLVER-TO-DIGITAL CONVERTER

BACKGROUND OF THE INVENTION

1. Technical Field

The present invention relates generally to gimbal-based tracking systems, and more particularly to a software-based resolver-to-digital converter implemented with existing system hardware, thereby reducing system size and cost.

2. Discussion

In many gimbal-based tracking and surveillance systems, it is necessary to determine the angle of rotation of a gimbaled instrument with respect to its mount in order for the system to function accurately. For example, in a two axis azimuth-elevation gimbal system, the system must track both the position of the inner elevation gimbal with respect to the outer azimuth gimbal, and the position of the outer azimuth gimbal with respect to the base. In order to compute the relative positions of the elevation and azimuth gimbals, a device must measure relative angles between the two gimbals.

A resolver is a common angular measurement device used for measuring these relative angles between the elevation and azimuth gimbals. A resolver exhibits excellent performance, is relatively low in cost, is small in size, and exhibits a high degree of reliability. Because of these characteristics, a resolver is ideal for use in precision pointing and stabilization systems.

In spite of the above-mentioned desirable characteristics, a resolver suffers from a limitation: it does not output the gimbal angle of rotation, but rather the sine and cosine of the particular angle of rotation. Thus, external instrumentation is required to compute the angle from the resolver-generated sine and cosine measurements.

The most common device for computing the angle of rotation from the resolver output is the resolver-to-digital converter integrated circuit (RDC). An RDC receives the sine and cosine analog outputs from the resolver, together with an analog reference signal, and produces a digital output that represents the angle of rotation.

Commercially available RDCs exhibit several desirable features. First, an RDC produces a digital output. As gimbal systems increasingly employ digital control electronics, the digital output from the RDC functions as an analog-to-digital interface with these digital control electronics. Second, an RDC is flexible in that the RDC is usually compatible with many types of resolvers, including resolvers with different reference frequencies. Third, an RDC is usually tolerant of reference amplitude and frequency drift, along with resolver temperature changes. Fourth, an RDC is relatively fast and produces a digital angle of rotation with relatively small time delay.

However, presently commercial RDCs also have several limitations. First, the cost of a typical RDC integrated circuit is high compared to other integrated circuits. As a result, the cost of a digital controller card using one or more RDCs is greatly increased. Second, an RDC consumes a considerable amount of physical space on a circuit board on which it is implemented. Typically, an RDC integrated circuit chip may range from 28 pins to as many as 44 pins. As increased emphasis is continually placed on reducing the number of circuit boards needed to implement control system electronics, the size of the RDC is becoming more and more of a critical factor. Third, commercially available RDCs are inflexible in that the RDCs can not be tailored to meet program-specific requirements. For example, the maximum reference frequency that can be handled by current generation RDCs is approximately 25 KHz. If a custom built resolver had a reference frequency of 40 KHz, a current generation RDC would be unable to determine the resolver angle. Thus, a custom made part would have to be manufactured, driving up the cost of the system considerably.

What is needed then is a resolver-to-digital converter that exhibits all of the above-mentioned advantages associated with commercially available RDCs and that is relatively inexpensive to implement, requires a relatively small amount of circuit board space and is flexible so that it is capable of meeting program-specific requirements.

SUMMARY OF THE INVENTION

In accordance with the teachings of the present invention, a software-based resolver-to-digital converter (RDC) is provided for use in computing the angle of rotation between gimbaled instruments in a gimbal-based system. The software-based RDC finds particular utility in military and airline surveillance, targeting and tracking systems in which position transducers such as resolvers are used to track the rotation of gimbal-mounted instrumentation. The present invention utilizes existing system hardware programmed to perform requisite computations. As a result, system cost and size is reduced.

In the inventive approach, gimbal-mounted instrumentation is provided in a gimbal system. A resolver is used to measure parameters of an angle of rotation associated with the instrumentation as the instrumentation rotates on the gimbal. The resolver outputs the measured parameters as analog signals, along with an analog reference signal. Multiplexing means are used to multiplex the signals output from the resolver. An analog to digital converter then converts the multiplexed analog signals to digital signals.

Digital processing means is programmed to compute the angle of rotation. The digital processing means includes three main components: filter means for receiving the multiplexed digital signals and for reducing unwanted noise and signal sensitivity; computing means for computing a value for the angle of rotation from the filter signals; and output means for outputting the computed angle of rotation to the system for processing to enhance system operation. The filter means and the computing and output means are coded into and implemented at the existing digital processing means, thereby eliminating the need for additional resolver-to-digital converter hardware components and reducing the cost of the system.

BRIEF DESCRIPTION OF THE DRAWINGS

Other objects and advantages of the invention will become apparent upon reading the following detailed description and upon reference to the drawings, in which.

DETAILED DESCRIPTION OF THE PREFERRED EMBODIMENT

The following description of the preferred embodiments is merely exemplary in nature and is in no way intended to limit the invention or its application or uses.

Figure 1:
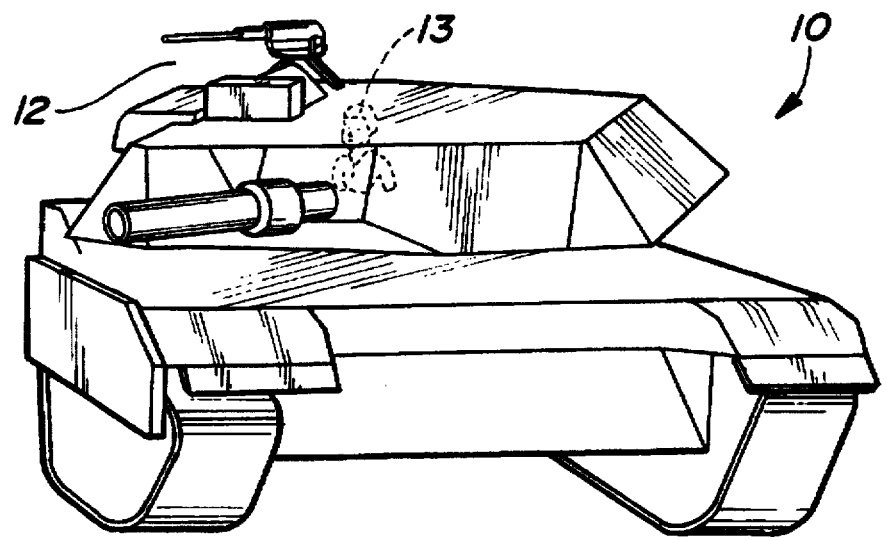
FIG. 1 is a perspective view of one type of environment in which the present invention may be implemented.

Referring to the drawings, FIG. 1 illustrates a perspective view of an M1A2 tank at 10 in which a gimbal-mounted gunners primary sight (GPS) 12 is implemented. The GPS 12 is a visual tracking system that allows a tank gunner (shown in phantom at 13) inside the tank to scan for, sight and lock on to detected targets. A sight unit of the GPS 12 incorporates a gimbal unit, such as the one shown at 14 in FIG. 2, that includes gimbal mounted instrumentation indicated generally at 16 and associated circuitry shown and described in detail below.

Figure 2:
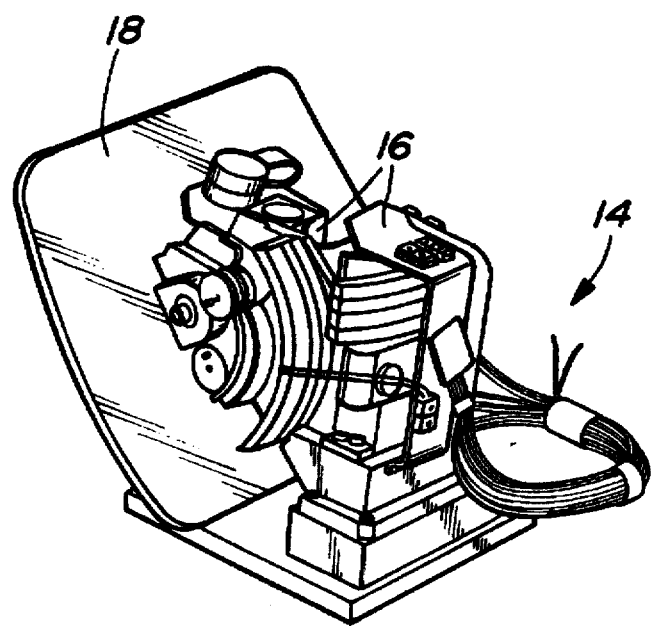
FIG. 2 shows a gimbal unit on which sighting instrumentation is mounted for use in the environment of FIG. 1.
Figure 3:
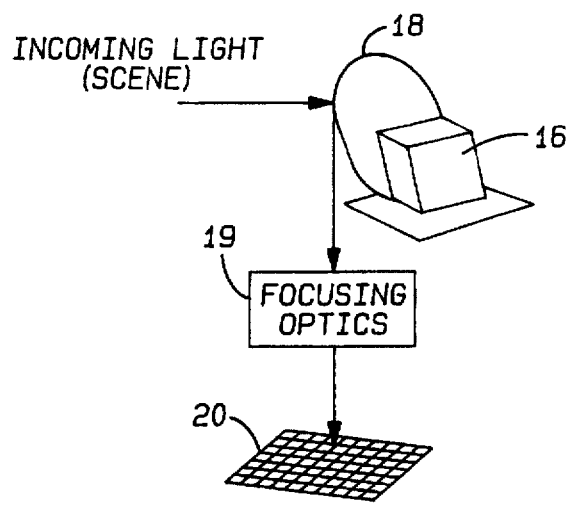
FIG. 3 shows additional components of the gimbal unit of FIG. 2.

FIG. 3 shows additional components of the gimbal unit of FIG. 2 located behind system mirror 18. As a target scene is detected by the GPS, the scene is reflected off of mirror 18, and focused by focusing optics 19 onto a scene detector 20 for processing. The scene detector is preferably a gyro of the type and well known in the art and may be either infrared or visible spectrum light sensitive. The gyro is used by the control system to stabilize the mirror 18 so that the scene is still imaged without blur even in the presence of base motion of the tank, such as when the tank drives over rough terrain.

Figure 4:
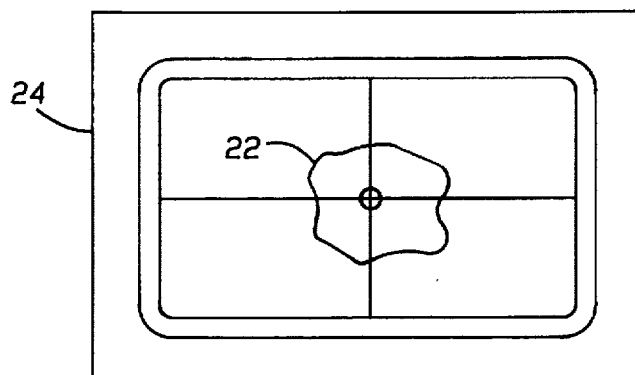
FIG. 4 illustrates a display screen of the sighting unit of FIG. 1 showing a detected target scene.

As is known, gimbal units such as the one shown at 14 are often installed in vehicles or equipment in which hardware components such as resolvers are used as position transducers to enhance the accuracy of tracking, targeting or surveillance equipment. The gimbal mounted instrumentation 16 is capable of rotating freely to allow the gunner 13 to effectively track and lock onto the target and follow the target, shown at 22 on a system display screen 24 in FIG. 4, in a manner well known to those skilled in the art regardless of the direction of movement of the tank 10.

Figure 5:
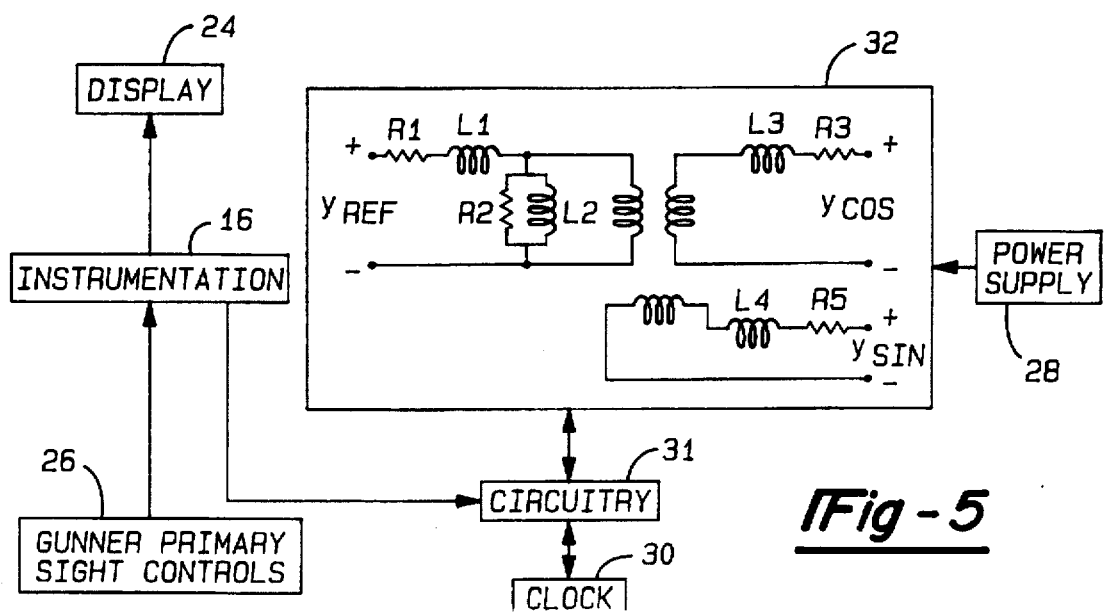
FIG. 5 is a block diagram of the gimbal sight unit system of FIG. 1.

Referring to FIG. 5, a block diagram of the GPS system 12 is shown. The system includes, in addition to gimbal mounted instrumentation 16 and display screen 24, gunner sight controls 26, a system power supply 28, a system clock 30, system circuitry 31 and a resolver 32. Gunner sight controls 26 allow the gunner 13 to manipulate the GPS 12 to locate and maintain a lock on the target 22. The system power supply 28 is remote from the instrumentation 16. Preferably, the vehicle in which the system is implemented supplies the power to the system. The system clock 30, preferably implemented in the system processor, is an integral part of the software-based timing routines of the present invention discussed below.

As is shown in FIG. 5, the resolver 32 can be modeled as a transformer having a rotor winding and two stator windings. The resolver 32, of a type well known to those skilled in the art, electromechanically measures parameters received from the scene detectors 20 and associated with the angle of shaft rotation $\Theta$ of the gimbal mounted instrumentation to stabilize the instrumentation as the GPS instrumentation 16 is slewed up, down left and/or right. The resolver 32 is excited by a reference voltage which may be generated either by the vehicle 10 or internally on an electronics board 34 shown in FIG. 6. The transformation of stator winding S1 is cos $\Theta$, while the transformation of stator winding S2 is sin $\Theta$. As shown in the model, the resolver measures sin $\Theta$ and cos $\Theta$ values associated with a particular gimbal-mounted instrument. Typically, one resolver is utilized for each piece of gimbaled instrumentation. In a typical three axis system in which azimuth, elevation and coarse azimuth are gyro stabilized, a separate resolver is required to measure the relative angle of each gimbal axis. As the resolver 32 is limited to computing the sine and cosine values of $\Theta$ for a gimbal-mounted instrument, additional computation is required to extract the value for $\Theta$ from these resolver measured values.

Figure 6:
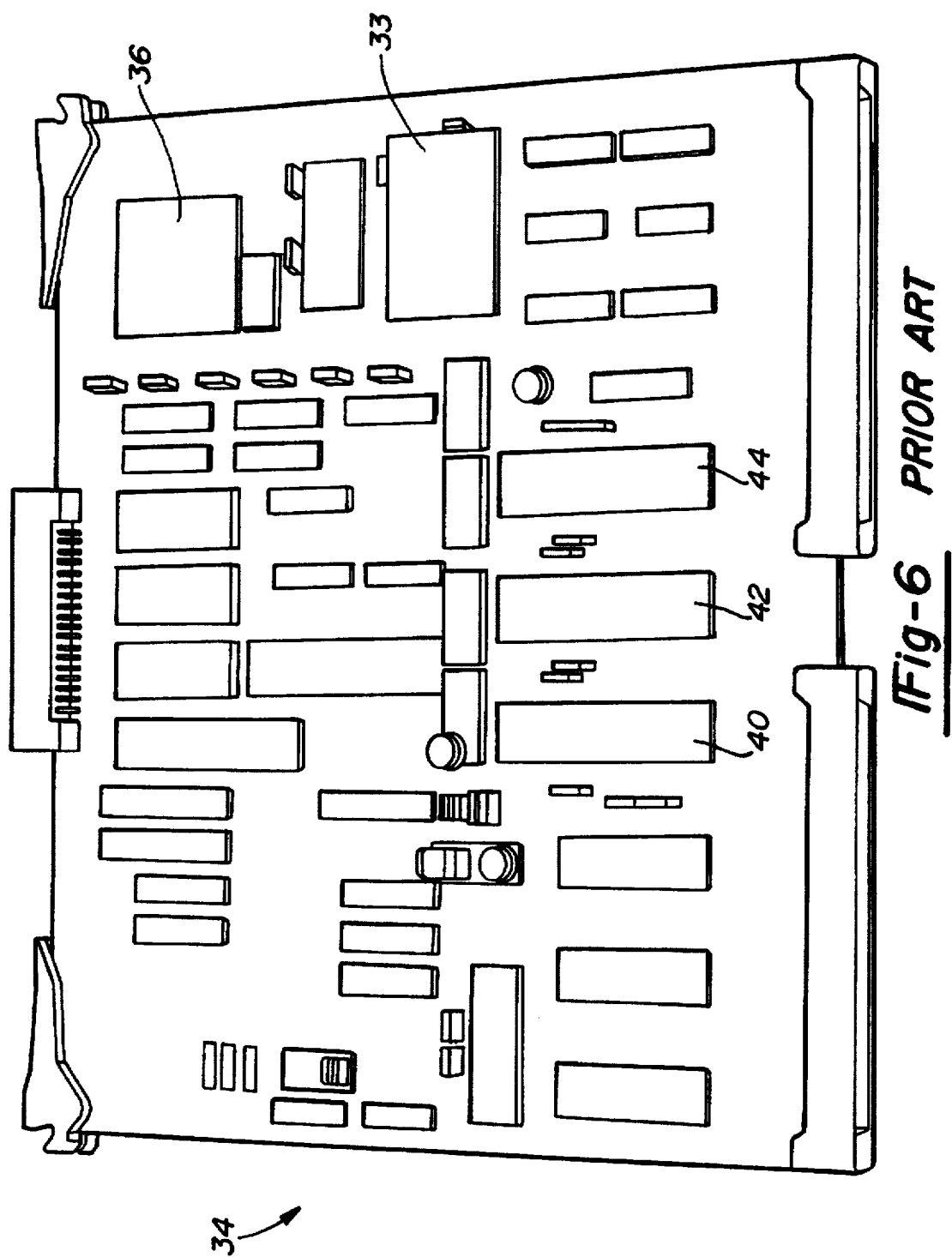
FIG. 6 is a top view of a circuit board on which the circuitry implementing a prior art resolver-to-digital converter is located.

Referring to FIG. 6, a top view of a circuit board 34 is shown on which circuitry is implemented to compute the value of $\Theta$. As shown, a digital signal processor (DSP) 36 performs various computations associated with the GPS system. The processor shown is an Analog Devices 2100 16 bit fixed point digital signal processor operating at 12.5 MHz. However, it should be understood that any commercially available digital signal processor may be implemented such as Texas Instruments TIC30, Motorola DSP 56001, Analog Devices ADSP 21000 and Motorola Model No. 96000 processors. It should also be understood that equivalent microprocessors, such as Motorola 68000 Series, Motorola Power PC or Intel X86 microprocessors may also be implemented in the system to perform system calculations and to implement the present invention, as will be described in detail below.

Still referring to FIG. 6, an analog to digital convertor 38 is also shown. This analog to digital convertor is a Datel Model No. ADS-106MC analog digital convertor. However, any commercially available M bit analog to digital convertor may be used. The analog to digital convertor converts analog signals output from the resolver 32 into digital signals. The digital signals in turn are then processed by the DSP 36. Also shown are commercially available hardware resolver to digital convertors (RDCs) 40, 42 and 44 that the present invention is designed to replace in a manner set forth in detail below.

Figure 7:
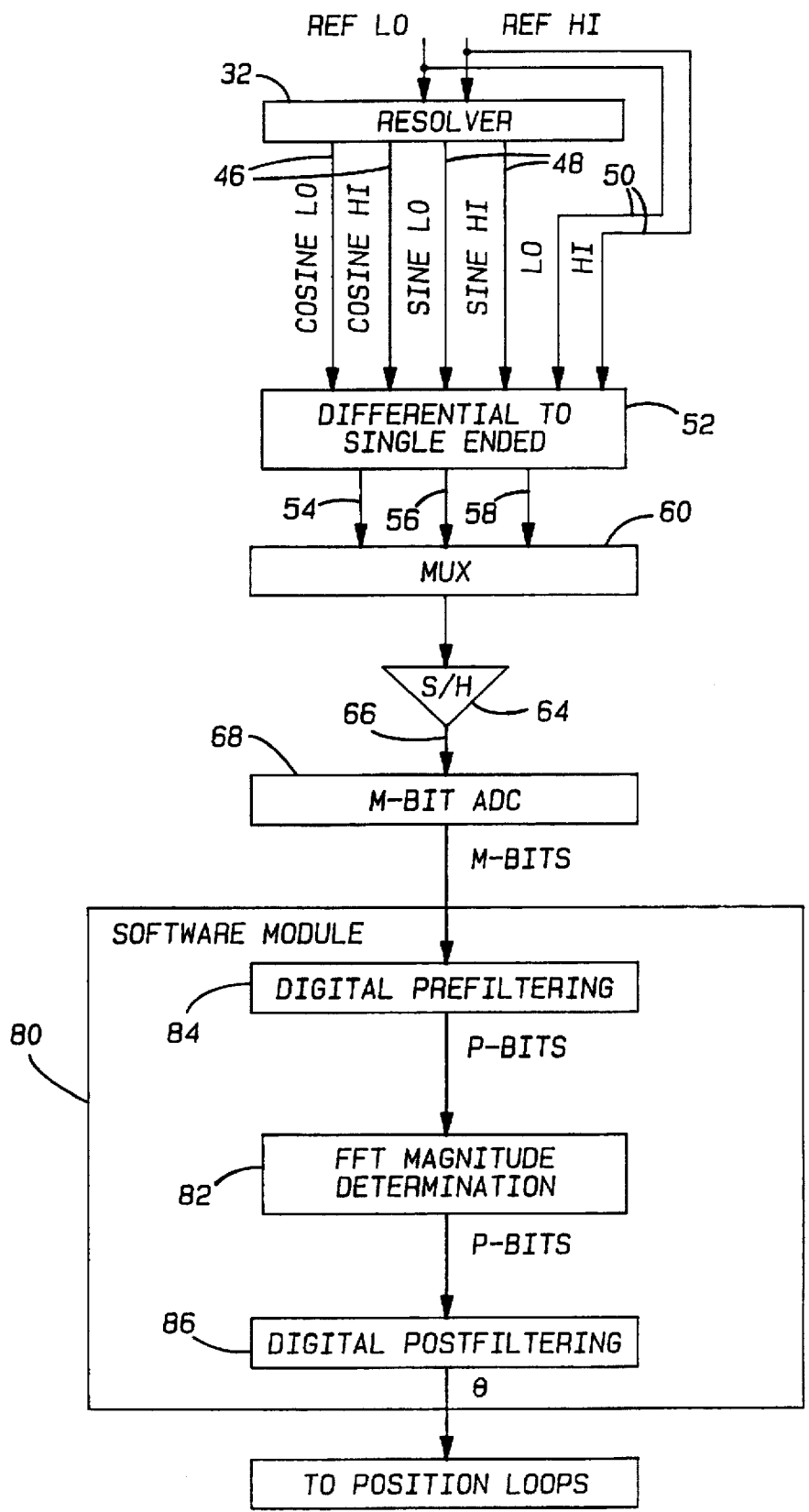
FIG. 7 is a block diagram of the resolver-to-digital converter of the present invention implemented by existing system components.

Turning now to FIG. 7, a block diagram of a preferred embodiment of the present invention is shown. As shown, the resolver 32 outputs signals corresponding to cos $\Theta$ output lines 46. The resolver 32 also outputs a signal corresponding to sin $\Theta$ output lines 48. In addition, the resolver reference signal inputs 50 are used as both inputs and outputs to the invention. Signals from output lines 46, 48 and 50 are input into a differential to single ended signal convertor 52. For low accuracy implementations where the resolver outputs are tied to system ground, the differential to single ended converter may be omitted. The convertor 52 converts the signals output from the resolver 32 to single ended signals, which are then output on lines 54, 56 and 58, respectively into a multiplexor 60. In addition, scaling may be done by the differential to single ended converter in order to scale the resolver signals to signal levels compatible to the multiplexor. The multiplexor multiplexes the signals input on lines 54, 56 and 58 and outputs the resulting multiplexed signals to the sample and hold amplifier 64. The sample and hold amplifier may be internal to an analog to digital converter (ADC) 68, or may be a separate integrated circuit. The ADC may be of the type discussed previously in conjunction with FIG. 5. The digital signal is then output from the ADC into the resolver to digital convertor of the present invention, shown generally at 80.

It should be understood at this point that the system in which the present invention is implemented typically includes a multiplexor as discussed above. If the system does not include a multiplexor, one may be added to the system for minimal cost and board space expense. All of the other above components in FIG. 7 are existing system components. Also, the signals output from the resolver 32 on lines 46, 48 and 50 are preferably converted from differential to single ended signals at the convertor 52. The conversion, while not always necessary, is preferably used for high performance applications where induced noise is to be kept to a minimum. It should also be understood each particular resolver input 46, 48 and 50 may require its own ADC to maximize the throughput, depending on the particular application.

Still referring to FIG. 7, the resolver to digital convertor 80 of the present invention includes three main components: an angle of rotation determination block 82; a digital pre-filter 84; and a digital post-filter 86. Each of the components 82, 84 and 86 is implemented at the digital signal processor 32 shown in FIG. 5, by programming the particular component functions into the processor in a manner well known to those skilled in the art, so that the processor carries out the particular function of each component 82, 84 and 86 as discussed now in greater detail. For example, Appendix A shows a preferred program written in assembly language for use with an Analog Devices 2100 processor that provides suitable instructions to the processor for carrying out these functions.

The angle of rotation magnitude determination block 82 performs three important functions:

1) it extracts the magnitude of the angle of rotation $\Theta$;

2) it determines the quadrant and resulting sign of $\Theta$ through computations in which the sine, cosine and reference outputs of the resolver are variables; and (3) it estimates the quadrature voltage for both the sine and cosine winding of the resolver.

The FFT magnitude determination block 82 computes the magnitude of the angle $\Theta$ as follows. Referring to the resolver circuit model shown in FIG. 3, sinusoidal reference voltage $Y_{ref}$ is applied across the resolver rotor winding. The sinusoidal reference voltage $Y_{ref}$ is related to the cosine and sine resolver outputs $Y_{cos}$ and $Y_{sin}$, respectively by the following equations:

$$y_{ref} = A \cos(2\pi f_{ref} t)$$

$$y_{cos} = A \cos(2\pi f_{ref} t + \phi) \cos(\theta) + q_c \sin(2\pi f_{ref} t + \phi) + V_{Cres}(t)$$

$$y_{sin} = A \cos(2\pi f_{ref} t + \phi) \sin(\theta) + q_s \sin(2\pi f_{ref} t + \phi) + V_{Sres}(t)$$

where $F_{ref}$ is the frequency of the reference drive, $\phi$ is the phase shift due to the RL combinations in the rotor circuit, $q_c$ is the quadrature magnitude for the cosine winding, $q_s$ is the quadrature magnitude for the sine winding, $V_{Cres}(t)$ and $V_{Sres}(t)$ are residual voltages often present that corrupt the signal output, and A is a constant. These residual components do not contain any fundamental components.

A Fast Fourier Transformation (FFT) function is programmed into the processor 36. As is well known, if a time sequence h(t) is sampled N times at a sampling frequency of $f_s$ hertz, the formula for an N point FFT is:

$$H(k) = \sum_{n=0}^{N-1} h(n\Delta T) e^{-j2\pi k n/N} \text{ for } k = 0, 1, \ldots N-1$$

where $\Delta T = 1/f_s$ and the sampling frequency $f_s$ is an integer multiple M of the reference frequency $f_{ref}$. If N=M, the reference frequency component of the FFT becomes:

$$H(f_{ref}) = h(0) + h(\Delta T) e^{-j2\pi/N} + \ldots h((n-1)\Delta T) e^{-j2\pi(n-1)/N}$$

$$= \sum_{n=0}^{N-1} h(n\Delta T) \cos(2\pi n/N) + j \sum_{n=0}^{N-1} h(n\Delta T) \sin(2\pi n/N)$$

$$= H_R(f_{ref}) + j H_I(f_{ref})$$

where the FFT is expressed in its real and imaginary components. This equation, when expressed in magnitude and phase forms, is as follows:

$$H(f_{ref}) = \sqrt{(H_R(f_{ref}))^2 + (H_I(f_{ref}))^2} \angle \tan^{-1}\left(\frac{H_I(f_{ref})}{H_R(f_{ref})}\right)$$

When this FFT equation is applied to the sine and cosine equations associated with the model resolver above, the following, given in magnitude phase form, result:

$$Y_{cos}(f_{ref}) = \sqrt{(A\cos(\theta))^2 + (q_c)^2} \angle (\phi + \phi_{clock} + \phi_{cquad})$$

$$Y_{sin}(f_{ref}) = \sqrt{(A\sin(\theta))^2 + (q_s)^2} \angle (\phi + \phi_{clock} + \phi_{squad})$$

In the above equation, $Y_{cos}(f_{ref})$ and $Y_{sin}(f_{ref})$ represent the value of the FFT of the cosine and sine at the fundamental frequency. Also, $\phi_{clock}$ represent the phase of the cosine and sine signals with respect to the computer clock, or the first sample of the sine and cosine, and $\phi_{cquad}$ and $\phi_{squad}$ represents the phase change due to the cosine and sine quadrature voltages, respectively. Assuming the quadrature voltages $q_c$ and $q_s$ are known, the magnitude of $A\cos(\Theta)$ and $A\sin(\Theta)$ is determined by the following:

$$|A\sin(\theta)|^2 = (Y_{sin}(f_{ref}))^2 - (q_s)^2$$

$$|A\cos(\theta)|^2 = (Y_{cos}(f_{ref}))^2 - (q_c)^2$$

The magnitude of $\Theta$ is thus determined by the following equation:

$$|\theta| = \tan^{-1}\left(\sqrt{\frac{(Y_{sin}(f_{ref}))^2 - (q_s)^2}{(Y_{cos}(f_{ref}))^2 - (q_c)^2}}\right)$$

In addition to the magnitude of $\Theta$, the resulting sign and quadrant location of $\Theta$ must also be calculated in order to properly control system functions. In determining the sign and the quadrant location of the angle of rotation, there is a non zero phase shift $\phi$ between the reference and sine and cosine signals. Assuming $\phi$ is known, a computer software reference $Y_{softref}$ is computed by the following equation:

$$Y_{softref} = \cos(2\pi f_{ref} t + \phi)$$

This reference is in phase with the sine and cosine signals and can be used to demodulate the angle $\Theta$ through the following equations:

$$\int_0^{1/f_{ref}} y_{softref}(t) y_{cos}(t) dt$$

$$= \int_0^{1/f_{ref}} \cos(2\pi f_{ref} t + \phi) \{A\cos(2\pi f_{ref} t + \phi)\cos(\theta) +$$

$$q_c \sin(2\pi f_{ref} t + \phi) + V_{Cres}(t)\} dt$$

-continued $$\equiv \frac{A\cos(\theta)}{\sqrt{2}} + 0 + 0 = \frac{A\cos(\theta)}{\sqrt{2}}$$

$$\int_0^{1/f_{ref}} y_{sqtr}(t) y_{sin}(t) dt \equiv \frac{A\sin(\theta)}{\sqrt{2}}$$

Thus, once the signs of cos Θ and sin Θ are known, the quadrant in which Θ is located is determined as computed by the following chart:

| COSINE SIGN | + | − | − | + |
|---|---|---|---|---|
| SINE SIGN | + | + | − | − |
| Θ QUADRANT | 1st | 2nd | 3rd | 4th |

Referring now to computation of the quadrature voltage, this voltage has the same frequency as the fundamental voltage, but is 90° out of phase with the fundamental frequency. The FFT magnitude determination block 82 which is a rectangular windowing function, is programmed to determine the quadrature voltage by measuring resolver stator voltages as the resolver rotates through a 0° fixed reference point. As sin Θ should equal 0 at the 0° reference, any voltage measured at the 0° reference point is tracked out of the angle of rotation calculation to compensate for the quadrature voltage during system calculations. This calculation may need be calculated only once at startup, or can be repeated periodically to compensate for thermal effects.

Referring now to the other components of the present invention as shown in FIG. 7, the digital prefilter 84 initially receives the digital input signals. The digital prefilter is a function programmed or coded into the digital signal processor and essentially acts as a filter around the reference frequency. Well known types of band pass filters, such as a Hanning window, a Blackman window, a rectangular windowing function or an analog band pass filter such as Chebyshev filter or a Butterworth filter may also be used. The essential function of the filter 84 is to eliminate noise common in such a system, as the system is frequently implemented in vehicles such as tanks, airplanes and other similar environments in which a significant amount of electrical and electromechanical interference is present.

The digital post-filter 86 may be implemented in the system to further reduce noise associated with the system. A lowpass filter is preferably used to filter the computed Θ signal before it is output. A lowpass filter is used because the output of the FFT magnitude determination block 82 is of a magnitude that may be represented as a DC quantity. Preferably, this digital filter 86 is an averager. However, it should be appreciated that other low pass filters such as Butterworth or Chebyshev filters could also be implemented through programming of the processor 36 to perform this particular function.

Figure 8:
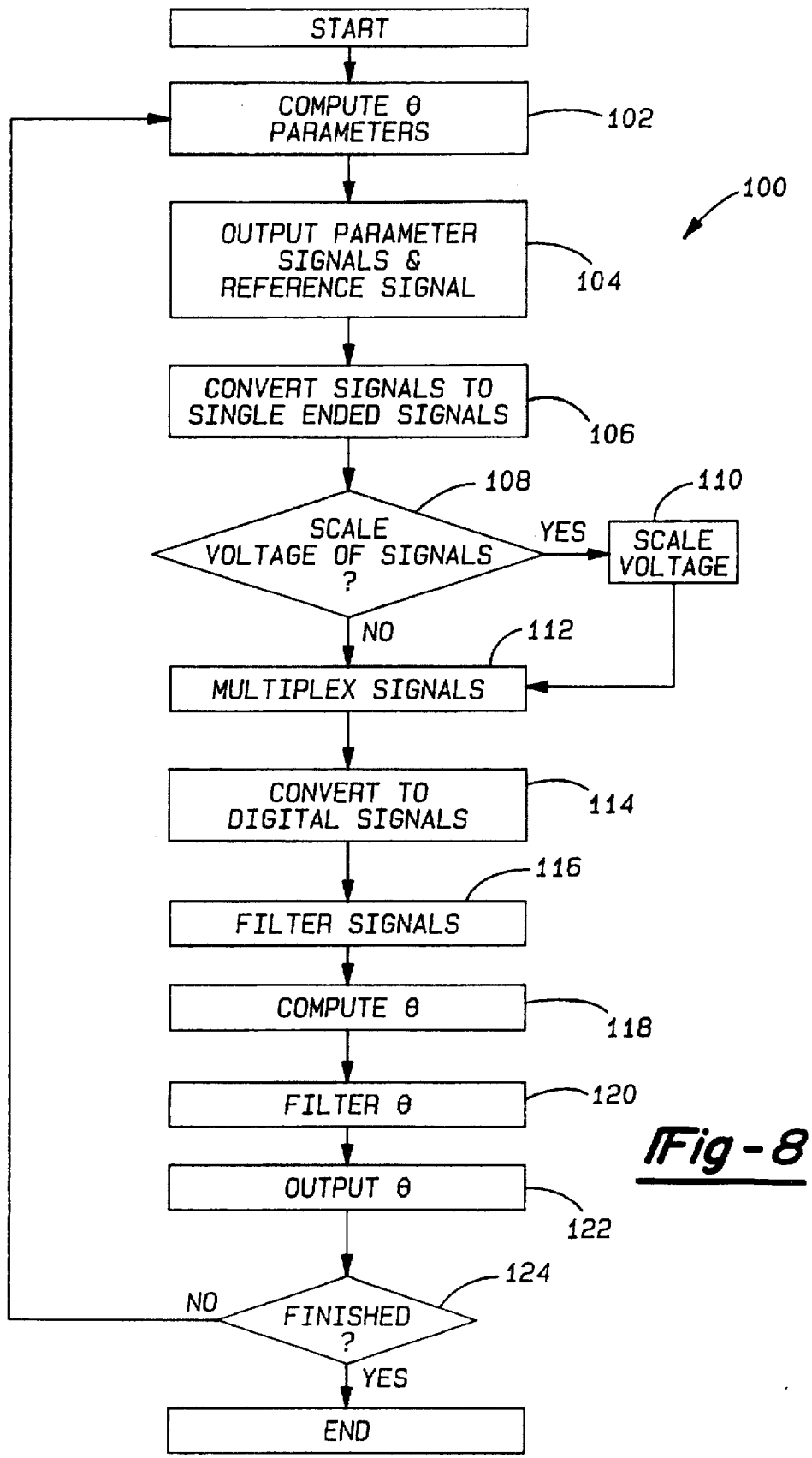
FIG. 8 is a flow diagram indicating the method by which the present invention functions.

FIG. 8 is a flow diagram, shown generally at 100, illustrating the operation of the system in which the resolver-to-digital converter of the present invention is implemented. At step 102, the resolver 32 computes parameters associated with Θ upon receiving signals from gimbal unit 14. At step 104, the resolver outputs the angular parameters along with a resolver reference signal. At step 106, the differential signals output from the resolver are converted to single ended signals by the converter 52. At step 108, if the input digital signals are not input at the required system voltage, the signal voltage is also scaled appropriately by the sample and hold amplifier 64 at step 110. Next, at step 112, the signals are multiplexed by multiplexor 60. At step 114, the multiplexed, single ended analog signals are converted to digital signals by the ADC 68.

The signals are then input into the processor 36 which is programmed to perform the requisite resolver-to-digital converter functions. At step 116, the signals are then filtered through filter 84 to eliminate noise and reduce signal sensitivity. At step 118, the resolver-to-digital converter of the present invention computes Θ at determination block 82. At step 120, the present invention filters the computed angle Θ at digital post-filter 86 to further reduce noise and enhance the accuracy of computation. At step 122, the resolver-to-digital converter of the present invention outputs the computed value for Θ to the system to enhance system stabilization and system accuracy. At step 124, the system determines whether the application is complete. If the application is not complete, the system repeats the method at a rate that is set corresponding to the input reference frequency. If the application is complete, the method ends.

By implementing the resolver-to-digital converter 80 at the digital signal processor 36, the cost of the system in which it is implemented is greatly reduced by eliminating the need for separate additional RDC integrated circuit chips. Further, as the number of requisite hardware components is reduced, thereby saving a large amount of space on the board 34 is saved, thus reducing the requisite size of the board 34.

It should also be appreciated that the software based resolver-to-digital converter 80 may be easily modified to operate at a desired particular frequency through minor software programming changes. This offers an advantage over present hardware based resolver-to-digital converters, as the hardware-based resolver-to-digital converters typically are designed to operate over a specific frequency range.

Further, by implementing the software based resolver-to-digital converter 80, the tracking rate of the gimbal system, indicating the maximum gimbal rate that can be achieved without the resolver-to-digital converter losing lock, can exceed 1000° per second, as compared to a typical rate for a hardware resolver at digital converter of about 120° per second.

It should be understood that the present inventions may be implemented in any system using resolvers or synchros, such as robotics systems, motor control systems, process control systems, systems that numerically control machine tools, and axis control systems. The present invention may be used in conjunction with a digital control system incorporating an analog to digital converter. The present invention is particularly suited for implementation in environments such as Korean EOTS, ALARM, IRST and Photonic Mast military systems. However, use of the present invention is contemplated for any land, air, sea or space-based tracking, targeting or surveillance system in which position transducers are implemented.

Various other advantages of the present invention will become apparent to those skilled in the art after having the benefit of studying the foregoing text and drawings, taken in conjunction with the following claims.

APPENDIX A

```
.MODULE/ROM/ABS=0    IRAD_SW_RDC;
{********************************************************************
  ADSP 2100 Software RDC Algorithm Code
  Author:  John Anagnost/M. H. Kieffer
  8/02/94
  Test version to generate 400 Hz square wave  9/12/94 MHK
  Added code to prevent sampling reference until it has settled.  MHK 9/30/94
********************************************************************}

.port           AzDriftCmd;
.port           ElDriftCmd;
.port           AzPosnOut;
.port           ElPosnOut;
.port           AzAdjPosnOut;
.port           InputPort;           { Input port to read system   }
                                     {   status                    }
.port           OutputPort;          { Output port to control system }
                                     {   operations                }
.port           StartADC;            {                             }
.port           StartRDC;            {                             }
.port           AzPosnFdbk;          {                             }
.port           ElPosnFdbk;          {                             }
.port           AnalogSample;        {                             }
.port           StopRDC;             {                             }
.port           DSPTimer;            { Programmable Interval Timer }
                                     {   control port              }
.port           DSPIRQ;              { 4 KHz servo interrupt       }
.port           SpinRef;             { 3200 Hz gyro spin motor ref }
.port           GyroRef;             { 40 KHz gyro pickoff ref     }
.port           AzTorqSet;           {                             }
.port           AzTorqCmd;           {                             }
.port           ElTorqSet;           {                             }
.port           ElTorqCmd;           {                             }
.port           MirrXTorqSet;        {                             }
.port           MirrXTorqCmd;        {                             }
.port           MirrYTorqSet;        {                             }
.port           MirrYTorqCmd;        {                             }
.port           AzPosnDC;            { Test DACs normally used to  }
.port           ElPosnDC;            {   monitor the DC Az El Posns }

{----------------- Output Parameters --------------------------------}

.external       SampleRef;           { Establish reference phase   }
.external       SimulRDC;            { RDC simulation algorithm    }

.entry          ProcessRDCInit;      { Routine accessible externally }

{----------- Data variables used by SampleRef ----------------------}

.var/dm/ram     YRefReal;            {                             }
.var/dm/ram     YRefImag;            {                             }
.var/dm/ram     PhaseClockToRef;     {                             }
.var/dm/ram     PhaseRotorToStator;  {                             }
.var/dm/ram     CosTotalPhase;       {                             }
.var/dm/ram     SinTotalPhase;       {                             }
.var/dm/ram     YRef[10];            {                             }
.var/dm/ram     CosRef[10];          {                             }

{----------- Data variables used by SimulRDC ----------------------}

.var/dm/ram     YCosReal;            {                             }
.var/dm/ram     YCosImag;            {                             }
.var/dm/ram     YSinReal;            {                             }
.var/dm/ram     YSinImag;            {                             }
.var/dm/ram     PyyCos;              {                             }
.var/dm/ram     PyySin;              {                             }
.var/dm/ram     QQ;                  {                             }
.var/dm/ram     CosSum;              {                             }
.var/dm/ram     SinSum;              {                             }
.var/dm/ram     SampCount;           {                             }
```

```
.var/dm/ram      RefSampleDone;          (                                    )
.var/dm/ram      ControlWord;            ( Copy of data last written to       )
.var/dm/ram      SqrtIterCount;          (                                    )
.var/dm/ram      RefCmdToggle;           (                                    )
.var/dm/ram      RDCAzPosn;
.var/dm/ram      PreSignQQ;
.var/dm/ram      YCos[10];               (                                    )
.var/dm/ram      YSin[10];               (                                    )
.var/dm/ram      RefSettleDelayCount;

{ ------------------- Lookup Tables ---------------------------------- }

.var/pm/rom      RefCos[10];             (                                    )
.var/pm/rom      RefSin[10];             (                                    )
.var/pm/rom      CosLookup[10];          (                                    )
.var/pm/rom      SinLookup[10];          (                                    )

.init            RefCos:    h#7FFF00,h#678E00,h#278E00,h#D87200,h#987200,
                            h#800000,h#987200,h#D87200,h#278E00,h#678E00;
.init            RefSin:    h#000000,h#4B3D00,h#79BC00,h#79BC00,h#4B3D00,
                            h#000000,h#B4C300,h#864400,h#864400,h#B4C300;
.init            CosLookup: h#0CCD00,h#0A5B00,h#03F500,h#FC0B00,h#F5A500,
                            h#F33300,h#F5A500,h#FC0B00,h#03F500,h#0A5B00;
.init            SinLookup: h#000000,h#078600,h#0C2C00,h#0C2C00,h#078600,
                            h#000000,h#F87A00,h#F3D400,h#F3D400,h#F87A00;

.global          ElDriftCmd;
.global          InputPort;              (                                    )
.global          OutputPort;             (                                    )
.global          StartADC;               (                                    )
.global          AnalogSample;           (                                    )
.global          AzTorqSet;              (                                    )
.global          AzTorqCmd;              (                                    )
.global          ElTorqSet;              (                                    )
.global          ElTorqCmd;              (                                    )
.global          MirrXTorqSet;           (                                    )
.global          MirrXTorqCmd;           (                                    )
.global          MirrYTorqSet;           (                                    )
.global          MirrYTorqCmd;           (                                    )
.global          AzPosnDC;               (                                    )
.global          ElPosnDC;               (                                    )
.global          YRefReal;               (                                    )
.global          YRefImag;               (                                    )
.global          PhaseClockToRef;        (                                    )
.global          PhaseRotorToStator;     (                                    )
.global          CosTotalPhase;          (                                    )
.global          SinTotalPhase;          (                                    )
.global          YRef;                   (                                    )
.global          CosRef;                 (                                    )
.global          YCosReal, YCosImag;     (                                    )
.global          YSinReal, YSinImag;     (                                    )
.global          PyyCos, PyySin;         (                                    )
.global          QQ;                     (                                    )
.global          CosSum, SinSum;         (                                    )
.global          YCos, YSin;             (                                    )
.global          SampCount;              (                                    )
.global          RefSampleDone;          (                                    )
.global          ControlWord;            ( Copy of data last written to       )
                                         (   output port                      )
.global          SqrtIterCount;          (                                    )
.global          RefCmdToggle;           (                                    )
.global          PreSignQQ;
.global          RefCos, RefSin;         (                                    )
.global          CosLookup, SinLookup;   (                                    )
.global          RefSettleDelayCount;
{ ------------------- END DECLARATIONS -------------------------------------- }
.newpage;
{ ------------------- INTERRUPT VECTORS ------------------------------------- } rti;                    ( Interrupt 0 is not used            )
                 rti;                    ( Interrupt 1 is not used            )
```

```
                jump ProcessCntlIRQ;     { Go to interrupt service     }
                rti;                     {    routines                 }
ProcessRDCInit:

{================= BEGIN INIT LOOP CONTROL CODE ==========================}

ICNTL=h#000C;            { Set interrupt control register}
                                         {   for non-nested and edge-    }
                                         {   triggered level 2 & 3       }
                                         {   interrupts                  }
                IMASK=h#0000;            { Set interrupt mask register   }
                                         {   to mask off all interrupts  }
                AX0 = h#4000;            { Get default output value      }
                dm(OutputPort)=AX0;      { Perform hardware reset        }
                dm(ControlWord)=AX0;     { Save the output value         }

{----------------- INITIALIZE TIMERS ------------------------------------}

AX0 = 0;                 {                               }
                AY0 = h#8000;            {                               }
                AR  = AX0 xor AY0;       {                               }
                dm(MirrXTorqSet)=AR;     {                               }
                nop;                     {                               }
                dm(MirrXTorqCmd)=AR;     {                               }
                nop;                     {                               }
                dm(MirrYTorqSet)=AR;     {                               }
                nop;                     {                               }
                dm(MirrYTorqCmd)=AR;     {                               }
                nop;                     {                               }
                dm(AzTorqSet)   =AR;     {                               }
                nop;                     {                               }
                dm(AzTorqCmd)   =AR;     {                               }
                nop;                     {                               }
                dm(ElTorqSet)   =AR;     {                               }
                nop;                     {                               }
                dm(ElTorqCmd)   =AR;     {                               }
                nop;                     {                               }
                dm(AzPosnDC)    =AR;     {                               }
                nop;                     {                               }
                dm(ElPosnDC)    =AR;     {                               }

{----------------- INITIALIZE TIMERS ------------------------------------}

AX0 = h#0036;            { Set up timer control word     }
                dm(DSPTimer)=AX0;        {   for square wave mode        }
                AX0 = h#00D0;            { Load initial count for 4 KHz  }
                dm(DSPIRQ)  =AX0;        {   hdwr servo interrupt        }
                AX0 = h#0007;            {                               }
                dm(DSPIRQ)  =AX0;        {                               }
                AX0 = h#0076;            { Set up timer control word     }
                dm(DSPTimer)=AX0;        {   for square wave mode        }
                AX0 = h#00C4;            { Load initial count for 3200 Hz}
                dm(SpinRef) =AX0;        {   gyro spin motor ref         }
                AX0 = h#0009;            {                               }
                dm(SpinRef) =AX0;        {                               }
                AX0 = h#00B6;            { Set up timer control word     }
                dm(DSPTimer)=AX0;        {   for square wave mode        }
                AX0 = h#00C8;            { Load initial count for 40 KHz }
                dm(GyroRef) =AX0;        {   gyro pickoff ref            }
                AX0 = h#0000;            {                               }
                dm(GyroRef) =AX0;        {                               }

M1 = 1;                  {                               }
                L0 = 0;                  {                               }
                L1 = 0;                  {                               }
                L2 = 0;                  {                               }
                L3 = 0;                  {                               }
                L4 = 0;                  {                               }
                L5 = 0;                  {                               }
```

```
                        AX0 = 10;                   {                                    }
                        dm(SampCount) = AX0;        {                                    }
                        AX0 = 0;                    {                                    }
                        dm(RefSampleDone) = AX0;    { Init to SampleRef                  } dm(YRefReal) = AX0;         {                                    }
                        dm(YRefImag) = AX0;         {                                    }
                        dm(PhaseClockToRef) = AX0;  {                                    }
                        dm(PhaseRotorToStator) = AX0;{                                   }
                        dm(CosTotalPhase) = AX0;    {                                    }
                        dm(SinTotalPhase) = AX0;    {                                    }
                        dm(RefCmdToggle) = AX0;     {                                    }

I0   = ^YRef;               {                                    }
                        CNTR= %YRef;                { Set counter with buffer length     }
                        do ClearYRef until CE;      { Clear YRef buffer                  }
ClearYRef:              dm(I0,M1) = AX0;            {                                    }

I0   = ^CosRef;             {                                    }
                        CNTR= %CosRef;              { Set counter with buffer length     }
                        do ClearCosRef until CE;    { Clear CosRef buffer                }
ClearCosRef:            dm(I0,M1) = AX0;            {                                    } dm(YCosReal) = AX0;         {                                    }
                        dm(YCosImag) = AX0;         {                                    }
                        dm(YSinReal) = AX0;         {                                    }
                        dm(YSinImag) = AX0;         {                                    }
                        dm(PyyCos) = AX0;           {                                    }
                        dm(PyySin) = AX0;           {                                    }
                        dm(QQ) = AX0;               {                                    }
                        dm(CosSum) = AX0;           {                                    }
                        dm(SinSum) = AX0;           {                                    }

I0   = ^YCos;               {                                    }
                        CNTR= %YCos;                { Set counter with buffer length     }
                        do ClearYCos until CE;      { Clear YCos buffer                  }
ClearYCos:              dm(I0,M1) = AX0;            {                                    }

I0   = ^YSin;               {                                    }
                        CNTR= %YSin;                { Set counter with buffer length     }
                        do ClearYSin until CE;      { Clear YSin buffer                  }
ClearYSin:              dm(I0,M1) = AX0;            {                                    }

I0 = ^YRef;                 { Init I0 for Reference sampling     }

AX0 = 8000;
                        dm(RefSettleDelayCount) = AX0;

{ Determine PhaseRotorToStator using oscilloscope. To be determined
  by software at a later date. }

{-------------------- WRAP UP AND WAIT FOR INTERRUPTS ----------------------} ena AR_SAT;                 { Enable ALU saturation mode         }
                        IMASK=h#000C;               { Enable edge-triggered inter-       }
                                                    {    rupts IRQ2 and IRQ3             }
WaitForInterrupt:       nop;                        {                                    }
                        jump WaitForInterrupt;      { Wait for 4kHz interrupt            }

{-------------------- END INITIALIZATION -----------------------------------}
.newpage;
{-------------------- INTERRUPT SERVICE ROUTINE FOR INTERRUPT 2 ------------}

ProcessCntlIRQ:         nop;                        {                                    }
                        AX0 = h#DPFF;               {                                    }
                        AY0 = dm(ControlWord);      { else DSP:=PeriCntl                 }
                        AR  = AX0 and AY0;          {      StartIbit:=true               }
                        dm(OutputPort) =AR;         {                                    }
                        dm(ControlWord)=AR;         {                                    }

{ Set up main loop so that there are two paths, either/or. First is
``` reference sampling, which continues for first ten samples at 4 kHz,
after which a flag is set to switch the routine to normal operation
for the remainder of the interrupts.  Normal operation consists of
sampling the two RDC inputs, sin and cos, adding to accumulation,
and calculating position every ten interrupts.  Gimbal DAC value is
also output on every tenth interrupt.
}

```
                    {       AY0 = dm(AzDriftCmd); }
                            AY0 = h#147B; ( = xx.xx deg; h#147B = 28.8 deg )
                            dm(PhaseRotorToStator) = AY0;

{ Generate 400 Hz reference signal    }
                            AX0 = dm(SampCount);
                            AY0 = 10;
                            AR  = AX0 - AY0;
                            if EQ jump SetSquareOut;
                            AY0 = 5;
                            AR  = AX0 - AY0;
                            if EQ jump ClearSquareOut;
                            jump CheckDelay;
SetSquareOut:               AX0 = h#FFFF;
                            dm(AzPosnDC) = AX0;
                            jump CheckDelay;
ClearSquareOut:             AX0 = h#8000;
                            dm(AzPosnDC) = AX0;

CheckDelay:                 AY0 = dm(RefSettleDelayCount);
                            AR  = pass AY0;
                            if EQ jump WhichPath;
                            AR  = AY0 - 1;
                            dm(RefSettleDelayCount) = AR;

WhichPath:                  AX0 = dm(RefSampleDone);{                              }
                            AR  = pass AX0;
                            if NE jump DoRDCProc;
                            call SampleRef;
                            jump FinishISR;
DoRDCProc:                  call SimulRDC;          {                              }

AcquirePosn:                dm(StartRDC) =AR;       { */ Inhibit Az & El RDCs   /* }
                            CNTR= 24;
                            do WaitForRDC1 until CE;
WaitForRDC1:                    nop;                    {Wait 3 microseconds        }
                                AY0 = h#8000;           {Load mask to invert MSB    }
                                AR  = dm(AzPosnFdbk);   {Read RDC channel 1         }
                                AR  = AR xor AY0;       {Invert MSB to get 2s complement}
                                dm(AzPosnOut)=AR;
                                dm(RDCAzPosn)=AR;
                                nop;

AY0 = h#8000;
                                AR  = dm(ElPosnFdbk);
                                AR  = AR xor AY0;       {Read RDC channel 2         }
                                                        {Invert MSB to get 2s complement}
                                dm(ElPosnOut)=AR;
                                nop;
                                dm(StopRDC)=AR;

FinishISR:                  AR  = dm(QQ);
                            dm(AzAdjPosnOut) = AR;
                            AY1 = h#8000;
                            AR  = AR xor AY1;       { TEST CODE - output qq signed }
ReleaseCPUInhibit:          AX0 = h#2000;           {                              }
                            AY0 = dm(ControlWord);  { else DSP:=PeriCntl           }
                            AR  = AX0 or AY0;       {     StartIbit:=true          }
                            dm(OutputPort) =AR;     {                              }
                            dm(ControlWord)=AR;     {                              }
ServoDone:                  rti;                    {                              }

.ENDMOD;
{ ----------------- END OF MAIN LOOP --------------------------- }
```

```
.MODULE/ROM   RDC_Reference_Phase;
{ ADSP 2100 RDC Reference signal characterization
  Author: John Anagnost/ M. Kieffer
  8/03/94

Input  : None
  Output : CosRef array values, state of RefSampleDone logical.
  Altered Registers: I0, I1, I3, I4, I5,
                     AX0, AX1, AY0, AY1, AR, AF,
                     MX0, MX1, MY0, MY1, MR, MF,
                     SR0, SR1, SI Description: Determine phase of reference signal relative to system clock.
  The notation is as follows: yr(1)= first sampled reference value
  at t=t0, yr(2) is the second sampled reference value at t=t0+1/4000,
  ...yr(10) is the tenth sampled reference value at t=t0 + 10/4000.
  yr = ADC sampled reference value - use another interrupt to trigger
  sampling, disable this interrupt after init has completed.

09/30/94: Added code to prevent exiting reference sample mode until
            reference has settled out.  MHK
}
.external    OutputPort;
.external    StartADC;
.external    AnalogSample;
.external    YRefReal;
.external    YRefImag;
.external    PhaseClockToRef;
.external    PhaseRotorToStator;
.external    CosTotalPhase;
.external    SinTotalPhase;
.external    YRef;
.external    CosRef;
.external    SampCount;
.external    RefSampleDone;
.external    ControlWord;
.external    YCos;
.external    YSin;
.external    CosLookup;
.external    SinLookup;

.external    arctan;
.external    sin;
.external    RefSettleDelayCount;

.ENTRY    SampleRef;

SampleRef:         AY0 = h#E0FF;          { ADC Mux mask clear           }
                   AR  = dm(ControlWord);
                   AR  = AR  and AY0;
                   AY0 = h#0C00;          { RDC Ref input mask - U5,pin 12 }
                   AR  = AR  or  AY0;
                   dm(ControlWord)=AR;
                   dm(OutputPort) =AR;
                   CNTR= 15;              { ADC Mux settling time }
                   do WaitForMUX1 until CE;
WaitForMUX1:       nop;
                   dm(StartADC)=AY0;
                   CNTR= 91;              { ADC conversion time }
                   do WaitForADC1 until CE;
WaitForADC1:       nop;
                   AR  = dm(AnalogSample);
                   AY0 = h#FFF0;
                   AR  = AR  and AY0;
                   dm(I0,M1)=AR;          { Store YRef          }

AY0 = dm(SampCount);
                   AR  = AY0 - 1;
                   if EQ jump ComputeRefPhase;
```

```
                        dm(SampCount) = AR;
                        jump ExitSampRef;
ComputeRefPhase:        AX0 = 10;
                        dm(SampCount) = AX0;

I0 = ^YRef;
                        AX0 = dm(RefSettleDelayCount);
                        AR  = pass AX0;
                        if GT jump ExitSampRef;

L0 = 0;
                        L1 = 0;
                        L4 = 0;
                        L5 = 0;
                        M1 = 1;
                        M5 = 1;

{ YRefReal =   YRef(1)*CosLookup(1)  + YRef(2)*CosLookup(2)
             + YRef(3)*CosLookup(3)  + YRef(4)*CosLookup(4)
             + YRef(5)*CosLookup(5)  + YRef(6)*CosLookup(6)
             + YRef(7)*CosLookup(7)  + YRef(8)*CosLookup(8)
             + YRef(9)*CosLookup(9)  + YRef(10)*CosLookup(10);  }

I0 = ^YRef;
                        I4 = ^CosLookup;

MR  = 0;
                        MX0 = dm(I0,M1);
                        MY0 = pm(I4,M5);
                        CNTR = 10;
                        do RefSampSumReal until CE;
RefSampSumReal:         MR  = MR+MX0*MY0 (ss), MX0 = dm(I0,M1), MY0 = pm(I4,M5);
                        if MV sat MR;
                        MX1 = MR1;
                        MY1 = MR0;
                        MR  = MR (rnd);
                        if MV sat MR;
                        dm(YRefReal) = MR1;

{ YRefImag =   YRef(1)*SinLookup(1)  + YRef(2)*SinLookup(2)
             + YRef(3)*SinLookup(3)  + YRef(4)*SinLookup(4)
             + YRef(5)*SinLookup(5)  + YRef(6)*SinLookup(6)
             + YRef(7)*SinLookup(7)  + YRef(8)*SinLookup(8)
             + YRef(9)*SinLookup(9)  + YRef(10)*SinLookup(10);  }

I0 = ^YRef;
                        I4 = ^SinLookup;

MR  = 0;
                        MX0 = dm(I0,M1);
                        MY0 = pm(I4,M5);
                        CNTR = 10;
                        do RefSampSumImag until CE;
RefSampSumImag:         MR  = MR+MX0*MY0 (ss), MX0 = dm(I0,M1), MY0 = pm(I4,M5);
                        if MV sat MR;
                        SR1 = MR1;
                        SR0 = MR0;
                        MR  = MR (rnd);
                        if MV sat MR;
                        dm(YRefImag) = MR1;

{ Determine phase angle using arctan algorithm.

if abs(YRefImag) < abs(YRefReal),
  PhaseClockToRef=atan(YRefImag/YRefReal)
else PhaseClockToRef=0.5-atan(YRefReal/YRefImag)  }

AX0 = dm(YRefReal);
                        AR  = abs AX0;
                        AX1 = AR;                   { abs(YRefReal) }
                        AX0 = dm(YRefImag);
```

```
                        AR  = abs AX0;
                        AY1 = AR;              ( abs(YRefImag) )
                        AR  = AY1 - AX1;
                        if EQ jump RealBigger;
                        if LT jump RealBigger;

( PhaseClockToRef=0.5-atan(YRefReal/YRefImag) )
ImagBigger:             AY1 = MX1;    ( MSW of YRefReal )
                        AY0 = MY1;    ( LSW of YRefReal )
                        AX1 = dm(YRefImag);
                        DIVS AY1, AX1;
                        DIVQ AX1; DIVQ AX1; DIVQ AX1;
                        DIVQ AX1; DIVQ AX1; DIVQ AX1;
                        DIVQ AX1; DIVQ AX1; DIVQ AX1;
                        DIVQ AX1; DIVQ AX1; DIVQ AX1;
                        DIVQ AX1; DIVQ AX1; DIVQ AX1;
                        AR  = AY0;
                        MY0 = 1;
                        MR  = AR * MY0 (ss);
CallArctanImagBig:      call arctan;
                        AR  = -AR;
                        AY0 = h#4000;
                        AR  = AR + AY0;
                        dm(PhaseClockToRef) = AR;  (0.5-arctan(YRefReal/YRefImag))
                        jump CalcTotalPhase;

( PhaseClockToRef=atan(YRefImag/YRefReal) )
RealBigger:             AY1 = SR1;    ( MSW of YRefImag )
                        AY0 = SR0;    ( LSW of YRefImag )
                        AX1 = dm(YRefReal);
                        DIVS AY1, AX1;
                        DIVQ AX1; DIVQ AX1; DIVQ AX1;
                        DIVQ AX1; DIVQ AX1; DIVQ AX1;
                        DIVQ AX1; DIVQ AX1; DIVQ AX1;
                        DIVQ AX1; DIVQ AX1; DIVQ AX1;
                        DIVQ AX1; DIVQ AX1; DIVQ AX1;
                        AR  = AY0;
                        MY0 = 1;
                        MR  = AR * MY0 (ss);
CallArctanRealBig:      call arctan;
                        dm(PhaseClockToRef) = AR;  ( arctan(YRefImag/YRefReal) )

( SinTotalPhase = sin(PhaseRotorToStator-PhaseClockToRef);
  CosTotalPhase = sin(0.5+PhaseRotorToStator+PhaseClockToRef); )

CalcTotalPhase:         nop;
                        AY0 = dm(PhaseRotorToStator);
                        AX0 = AR;
                        dis AR_SAT;
                        AR  = AY0 - AX0;
                        ena AR_SAT;
                        AX0 = AR;     ( PhaseRotorToStator - PhaseClockToRef )
                        call sin;
                        dm(SinTotalPhase) = AR;
                        AY1 = h#4000;
                        dis AR_SAT;
                        AR  = AX0 + AY1;  ( 0.5 + PhaseRotorToStator-PCTR )
                        ena AR_SAT;
                        AX0 = AR;
                        call sin;
AssignCosTotalPhase:    dm(CosTotalPhase) = AR;

( CosRef(1) = CosLookup(1)*CosTotalPhase - SinLookup(1)*SinTotalPhase;
  CosRef(2) = CosLookup(2)*CosTotalPhase - SinLookup(2)*SinTotalPhase;
  CosRef(3) = CosLookup(3)*CosTotalPhase - SinLookup(3)*SinTotalPhase;
  CosRef(4) = CosLookup(4)*CosTotalPhase - SinLookup(4)*SinTotalPhase;
  CosRef(5) = CosLookup(5)*CosTotalPhase - SinLookup(5)*SinTotalPhase;
  CosRef(6) = CosLookup(6)*CosTotalPhase - SinLookup(6)*SinTotalPhase;
  CosRef(7) = CosLookup(7)*CosTotalPhase - SinLookup(7)*SinTotalPhase;
  CosRef(8) = CosLookup(8)*CosTotalPhase - SinLookup(8)*SinTotalPhase;
  CosRef(9) = CosLookup(9)*CosTotalPhase - SinLookup(9)*SinTotalPhase;
```

```
              CosRef(10) = CosLookup(10)*CosTotalPhase - SinLookup(10)*SinTotalPhase;  }
                          I0 = ^CosRef;
                          I4 = ^CosLookup;
                          I5 = ^SinLookup;

MX0 = pm(I4,M5);
                          MY0 = dm(CosTotalPhase);
                          AR  = dm(SinTotalPhase);
                          AR  = -AR;
                          MY1 = AR;
                          CNTR = 10;
                          do CosRefCalc until CE;
                          MR  = MX0*MY0 (ss), MX0 = pm(I5,M5);
                          MR  = MR+MX0*MY1 (rnd), MX0 = pm(I4,M5);
                          if MV sat MR;
CosRefCalc:               dm(I0,M1) = MR1;

I0  = ^YCos;              ( Assign I0 to YCos array )
                          I1  = ^YSin;              ( Assign I0 to YSin array )
                          AX0 = 1;
                          dm(RefSampleDone) = AX0;
ExitSampRef:              rts;

.ENDMOD;
```

```
.MODULE/ROM     RDC_Simulation;
{ ADSP 2100 RDC simulation algorithm
  Author: John Anagnost/ M. Kieffer
  8/03/94

Input  : None
  Output : CosRef array values, state of SampleRefDone logical.
  Altered Registers:  I0,  I1,  I2,  I3,  I4,  I5,
                      AX0, AX1, AY0, AY1, AR,  AF,
                      MX0, MX1, MY0, MY1, MR,  MF,
                      SR0, SR1, SI Compute every 1/400 seconds.  Data should be taken at 4 KHz intervals.
  The notation is as follows: yc(1) = first sampled cosine value at t=t0,
  yc(2) is the second sampled cosine value at t=t0+1/4000, ...yc(10) is
  the tenth sampled cosine value at t=t0 + 10/4000.  The notation is
  similar for the sampling of the sine winding, ys(1), ys(2), ... ys(10)
}

.external       ElDriftCmd;
.external       OutputPort;
.external       StartADC;
.external       AnalogSample;
.external       AzPosnDC;
.external       ElPosnDC;
.external       YRef;
.external       CosRef;
.external       YCosReal;
.external       YCosImag;
.external       YSinReal;
.external       YSinImag;
.external       PyyCos;
.external       PyySin;
.external       QQ;
.external       CosSum;
.external       SinSum;
.external       SampCount;
.external       RefSampleDone;
.external       ControlWord;
.external       RefCmdToggle;
.external       PreSignQQ;
.external       YCos;
.external       YSin;
.external       CosLookup;
.external       SinLookup;
.var/dm/ram     PhaseCos;

.external       sin;
.external       sqrt5;
.external       arctan;

.ENTRY  SimulRDC;

SimulRDC:       AY0 = h#E0FF;           { ADC Mux mask clear          }
                AR  = dm(ControlWord);
                AR  = AR  and AY0;
                AY0 = h#1600;           { RDC Cos input mask - A2-P2-A31 }
                AR  = AR  or  AY0;
                dm(ControlWord)=AR;
                dm(OutputPort) =AR;
                CNTR= 15;               { ADC Mux settling time }
                do WaitForMUX2 until CE;
WaitForMUX2:        nop;
                dm(StartADC)=AY0;
                AY0 = h#1700;           { RDC Sin input mask - A2-P2-A32 }
                AR  = AR  or  AY0;
                dm(ControlWord)=AR;
                dm(OutputPort) =AR;
                CNTR= 86;               { ADC conversion time }
                do WaitForADC2 until CE;
```

```
WaitForADC2:              nop;
                          AR  = dm(AnalogSample);
                          AY0 = h#FFF0;
                          dm(StartADC)=AY0;
                          AR  = AR  and AY0;
                          dm(I0,M1)=AR;          { Store YCos(k)        }
                          AY1 = h#8000;          { TEST CODE }
                {         AR  = AR  xor AY1;     { TEST CODE }
                {         dm(ElPosnDC) = AR;     { TEST CODE }
                          CNTR= 91;              { ADC conversion time }
                          do WaitForADC3 until CE;
WaitForADC3:              nop;
                          AR  = dm(AnalogSample);
                          AR  = AR  and AY0;
                          dm(I1,M1)=AR;          { Store YSin(k)        }
                          AR  = AR  xor AY1;     { TEST CODE }
                {         dm(ElPosnDC) = AR;     { TEST CODE }

AY0 = dm(SampCount);
                          AR  = AY0 - 1;
                          if EQ jump ComputeRDCAngle;
                          dm(SampCount) = AR;
                          jump ExitRDCSimul;
ComputeRDCAngle:          AX0 = 10;
                          dm(SampCount) = AX0;

{ YCosReal =  YCos(1)*CosLookup(1) + YCos(2)*CosLookup(2)
            + YCos(3)*CosLookup(3) + YCos(4)*CosLookup(4)
            + YCos(5)*CosLookup(5) + YCos(6)*CosLookup(6)
            + YCos(7)*CosLookup(7) + YCos(8)*CosLookup(8)
            + YCos(9)*CosLookup(9) + YCos(10)*CosLookup(10);  }

I0  = ^YCos;
                          I4  = ^CosLookup;
                          MR  = 0;
                          CNTR = %YCos;
                          MX0 = dm(I0,M1);
                          MY0 = pm(I4,M5);
                          do YCosRealSum until CE;
YCosRealSum:              MR  = MR+MX0*MY0 (ss), MX0 = dm(I0,M1), MY0 = pm(I4,M5);
                          MR  = MR (rnd);
                          if MV sat MR;
                          dm(YCosReal) = MR1;

{ YCosImag =  YCos(1)*SinLookup(1) + YCos(2)*SinLookup(2)
            + YCos(3)*SinLookup(3) + YCos(4)*SinLookup(4)
            + YCos(5)*SinLookup(5) + YCos(6)*SinLookup(6)
            + YCos(7)*SinLookup(7) + YCos(8)*SinLookup(8)
            + YCos(9)*SinLookup(9) + YCos(10)*SinLookup(10);  }

I0  = ^YCos;
                          I5  = ^SinLookup;
                          MR  = 0;
                          CNTR = %YCos;
                          MX0 = dm(I0,M1);
                          MY0 = pm(I5,M5);
                          do YCosImagSum until CE;
YCosImagSum:              MR  = MR+MX0*MY0 (ss), MX0 = dm(I0,M1), MY0 = pm(I5,M5);
                          MR  = MR (rnd);
                          if MV sat MR;
                          dm(YCosImag) = MR1;

{ YSinReal =  YSin(1)*CosLookup(1) + YSin(2)*CosLookup(2)
            + YSin(3)*CosLookup(3) + YSin(4)*CosLookup(4)
            + YSin(5)*CosLookup(5) + YSin(6)*CosLookup(6)
            + YSin(7)*CosLookup(7) + YSin(8)*CosLookup(8)
            + YSin(9)*CosLookup(9) + YSin(10)*CosLookup(10);  }

DoYSinReal:               I1  = ^YSin;
                          I4  = ^CosLookup;
                          MR  = 0;
```

```
                    CNTR = %YSin;
                    MX0  = dm(I1,M1);
                    MY0  = pm(I4,M5);
                    do YSinRealSum until CE;
YSinRealSum:        MR   = MR+MX0*MY0 (ss), MX0 = dm(I1,M1), MY0 = pm(I4,M5);
                    MR   = MR (rnd);
                    if MV sat MR;
                    dm(YSinReal) = MR1;

{ YSinImag  =   YSin(1)*SinLookup(1) + YSin(2)*SinLookup(2)
            +   YSin(3)*SinLookup(3) + YSin(4)*SinLookup(4)
            +   YSin(5)*SinLookup(5) + YSin(6)SinLookup(6)
            +   YSin(7)*SinLookup(7) + YSin(8)*SinLookup(8)
            +   YSin(9)*SinLookup(9) + YSin(10)*SinLookup(10);   }

I1   = ^YSin;
                    I5   = ^SinLookup;
                    MR   = 0;
                    CNTR = %YSin;
                    MX0  = dm(I1,M1);
                    MY0  = pm(I5,M5);
                    do YSinImagSum until CE;
YSinImagSum:        MR   = MR+MX0*MY0 (ss), MX0 = dm(I1,M1), MY0 = pm(I5,M5);
                    MR   = MR (rnd);
                    if MV sat MR;
                    dm(YSinImag) = MR1;

{ PyyCos = YCosReal^2+YCosImag^2;   }

MX0  = dm(YCosReal);
                    MY0  = MX0;
                    MR   = MX0 * MY0 (ss);
                    MX0  = dm(YCosImag);
                    MY0  = MX0;
                    MR   = MR + MX0 * MY0 (ss);
                    MX1  = MR1;   ( PyyCos HI )
                    MY1  = MR0;   ( PyyCos LO )
                    MR   = MR (rnd);

if MV sat MR;
                    dm(PyyCos) = MR1;

{ PyySin = YSinReal^2+YSinImag^2;   }

MX0  = dm(YSinReal);
                    MY0  = MX0;
                    MR   = MX0 * MY0 (ss);
                    MX0  = dm(YSinImag);
                    MY0  = MX0;
                    MR   = MR + MX0 * MY0 (ss);
                    if MV sat MR;
                    SR1  = MR1;   ( PyySin HI )
                    SR0  = MR0;   ( PyySin LO )
                    MR   = MR (rnd);
                    if MV sat MR;
                    dm(PyySin) = MR1;
TestLabel:          nop;

{ Compute angle using numerical square root algorithm and Analog
  Devices' arc tangent algorithm.  See accompanying sheets for algorithms.
  Angle is scaled by -1 = -180  and 1 = 180 if PyySin < PyyCos,
  qq = atan(sqrt5(PyySin/PyyCos));
else qq = 0.5 - atan(sqrt5(PyyCos/PyySin));   }

AX1  = dm(PyyCos);
                    AY1  = dm(PyySin);
                    AR   = AY1 - AX1;
                    if EQ jump PyyCosBigger;
                    if LT jump PyyCosBigger;
```

```
PyySinBigger:          { QQ = 0.5 - atan(sqrt5(PyyCos/PyySin)) }
                       AY1 = MX1;    { MSW of PyyCos }
                       AY0 = MY1;    { LSW of PyyCos }
                       AX1 = dm(PyySin);
                       DIVS AY1, AX1;
                       DIVQ AX1; DIVQ AX1; DIVQ AX1;
                       DIVQ AX1; DIVQ AX1; DIVQ AX1;
                       DIVQ AX1; DIVQ AX1; DIVQ AX1;
                       DIVQ AX1; DIVQ AX1; DIVQ AX1;
                       DIVQ AX1; DIVQ AX1; DIVQ AX1;
                       SR0 = AY0;
                       call sqrt5;   { sqrt5(PyyCos/PyySin) }
                       MY0 = 1;
                       MR = SR1 * MY0 (ss);
                       call arctan;
                       AY0 = h#4000;
                       AR  = -AR;
                       AR  = AR + AY0;
                       dm(QQ) = AR;  { 0.5 - arctan(sqrt5(PyyCos/PyySin)) }
                       jump FindSign;

PyyCosBigger:          AY1 = SR1;    { MSW of PyySin }
                       AY0 = SR0;    { LSW of PyySin }
                       AX1 = dm(PyyCos);
                       DIVS AY1, AX1;
                       DIVQ AX1; DIVQ AX1; DIVQ AX1;
                       DIVQ AX1; DIVQ AX1; DIVQ AX1;
                       DIVQ AX1; DIVQ AX1; DIVQ AX1;
                       DIVQ AX1; DIVQ AX1; DIVQ AX1;
                       DIVQ AX1; DIVQ AX1; DIVQ AX1;
                       SR0 = AY0;
                       call sqrt5;   { sqrt5(PyySin/PyyCos) }
TestLabel1:            nop;
                       MY0 = 1;
                       MR = SR1 * MY0 (ss);
TestLabel2:            nop;
                       call arctan;
TestLabel3:            nop;
                       dm(QQ) = AR;

{ Determine sign of resolver angle }

FindSign:              nop;
                       dm(PreSignQQ) = AR;
                       I0  = ^YCos;
                       I2  = ^CosRef;
                       MR  = 0;

{ CosSum = YCos(1)*CosRef(1) + YCos(2)*CosRef(2)
         + YCos(3)*CosRef(3) + YCos(4)*CosRef(4)
         + YCos(5)*CosRef(5) + YCos(6)*CosRef(6)
         + YCos(7)*CosRef(7) + YCos(8)*CosRef(8)
         + YCos(9)*CosRef(9) + YCos(10)*CosRef(10); }

CNTR = %YCos;
                       MX0 = dm(I0,M1);
                       MY0 = dm(I2,M1);
                       do CalcCosSum until CE;
                       MR  = MR+MX0*MY0 (ss), MX0 = dm(I0,M1);
CalcCosSum:            MY0 = dm(I2,M1);
                       MR  = MR (rnd);
                       if MV sat MR;
                       dm(CosSum) = MR1;
                       I1 = ^YSin;
                       I2 = ^CosRef;
                       MR = 0;

{ SinSum = YSin(1)*CosRef(1) + YSin(2)*CosRef(2)
         + YSin(3)*CosRef(3) + YSin(4)*CosRef(4)
         + YSin(5)*CosRef(5) + YSin(6)*CosRef(6)
```

```
                    + YSin(7)*CosRef(7) + YSin(8)*CosRef(8)
                    + YSin(9)*CosRef(9) + YSin(10)*CosRef(10); }

CNTR = %YSin;
                        MX0  = dm(I1,M1);
                        MY0  = dm(I2,M1);
                        do CalcSinSum until CE;
                        MR   = MR+MX0*MY0 (ss), MX0 = dm(I1,M1);
CalcSinSum:             MY0  = dm(I2,M1);
                        MR   = MR (rnd);
                        if MV sat MR;
                        dm(SinSum) = MR1;

{ if SinSum => 0,
     if CosSum => 0, qq = qq;
     else qq = 1 - qq;
  elseif CosSum => 0, qq = -qq;
  else qq = qq - 1; }

AR  = pass MR1;
                        if EQ jump SinSumGE0;
                        if GT jump SinSumGE0;
SinSumLT0:              AX0 = dm(CosSum);
                        AR  = pass AX0;
                        if EQ jump NegateQQ;
                        if GT jump NegateQQ;
                        AY0 = h#8000;
                        AR  = dm(QQ);
                        AR  = AR + AY0;     { qq = qq - 1 }
                        jump StoreQQ;
NegateQQ:               AR  = dm(QQ);
                        AR  = -AR;
                        jump StoreQQ;
SinSumGE0:              AX0 = dm(CosSum);
                        AR  = pass AX0;
                        if EQ jump StetQQ;
                        if GT jump StetQQ;
                        AR  = dm(QQ);
                        AY0 = h#8000;       { -1 }
                        AR  = AR + AY0;     { qq - 1 }
                        AR  = -AR;          { 1 - qq }
StoreQQ:                dm(QQ) = AR;
StetQQ:                 AY0 = 0; { dm(ElDriftCmd); }
                        AR  = AY0 - 1;
                        if NE jump ToggleRefCmd;
                        AX0 = dm(RefCmdToggle);
                        AR  = pass AX0;
                        if EQ jump ResetRefSampDone;
                        jump ResetSinCos;
ToggleRefCmd:           AX0 = 0;
                        dm(RefCmdToggle) = AX0;
ResetSinCos:            I0  = ^YCos;
                        I1  = ^YSin;
                        AX0 = dm(QQ);
                        jump ExitRDCSimul;
ResetRefSampDone:       AX0 = 0;
                        dm(RefSampleDone) = AX0;
                        AX0 = 1;
                        dm(RefCmdToggle) = AX0;
                        I0  = ^YRef;
ExitRDCSimul:           nop;
                        AR  = dm(QQ);
                        AY1 = h#8000;       { TEST CODE - output qq }
                        AR  = AR xor AY1;   { TEST CODE - output qq }
                        dm(ElPosnDC) = AR;  { TEST CODE - output qq }
                        rts;

.ENDMOD;
{ Use qq as angle for position loops, with the before
  mentioned scaling:  -1 = -180 , 1 = 180 . }
```

```
.MODULE/ROM   Sin_Approximation;
{        Sine Approximation
              Y = Sin(x)

Calling Parameters
             AX0 = x in scaled 1.15 format
             M1 = 1
             L3 = 0

Return Values
             AR = y in 1.15 format

Altered Registers
             AY0,AF,AR,MY1,MX1,MF,MR,SR,I3

Computation Time
             25 cycles}

.VAR/DM   sin_coeff[5];

.INIT     sin_coeff : H#3240, H#0053, H#AACC, H#08B7, H#1CCE;

.ENTRY    sin;

sin:      I3=^sin_coeff;                        {Pointer to coeff. buffer}
          AY0=H#4000;
          AR=AX0, AF=AX0 AND AY0;               {Check 2nd or 4th quad.}
          IF NE AR=-AX0;                        {If yes, negate input}
          AY0=H#7FFF;
          AR=AR AND AY0;                        {Remove sign bit}
          MY1=AR;
          MF=AR*MY1 (RND), MX1=DM(I3,M1);       {MF = x**2}
          MR=MX1*MY1 (SS), MX1=DM(I3,M1);       {MR = C1*x}
          CNTR=3;
          DO ApproxSine UNTIL CE;
                  MR=MR+MX1*MF (SS);
ApproxSine:       MF=AR*MF (RND), MX1=DM(I3,M1);
          MR=MR+MX1*MF (SS);
          SR=ASHIFT MR1 BY 3 (HI);

SR=SR OR LSHIFT MR0 BY 3 (LO);        {Convert to 1.15 format}
          AR=PASS SR1;
          IF LT AR=PASS AY0;                    {Saturate if needed}
          AF=PASS AX0;
          IF LT AR=-AR;                         {Negate output if needed}
          RTS;
.ENDMOD;
```

```
.MODULE/ROM   Square_Root;
{ ADSP 2100 RDC square root algorithm
  Author:  John Anagnost/ M. Kieffer
  8/02/94

Input is assumed to be in the interval [0 1].

Registers used: AX0, AX1, AY0, AY1, SR, MR, MX0, MX1, MY0, MY1, AR, AF

Input : SR0
   Output: SR1
   Result is in 1.15 format if input is.}

.external   SqrtIterCount;           { Counts iterations of algorithm }

.ENTRY    sqrt5;

Sqrt5:       AX0 = SR0;      { x1 }
             AR = pass AX0;
             if NE jump InitX2;
             MX0 = 0;
             jump SqrtDone;
InitX2:      AY0 = h#7FFF;   { x2 }
             MX0 = SR0;      { x3 }
             MY0 = h#4000;
             AX1 = 0;
             dm(SqrtIterCount) = AX1;
             AY1 = 0;
             AF  = AX1 + AY1;
SqrtLoop:    AY1 = dm(SqrtIterCount);
             AR  = AY1 + 1;
             dm(SqrtIterCount) = AR;
             AR  = AX0 - AY0;
             MR  = AR * MY0 (rnd);
             AR  = abs MR1;
             AY1 = 2;
             AR  = AR - AY1;
             if LT jump SqrtDone;    { if abs(x1-x2)/2> 2 LSBs, }
             MX1 = AX0;      { x1 }
             MR  = MX1 * MY0 (ss);   { (x1)/2 +
             MX1 = AY0;      { x2 }
             MR  = MR + MX1 * MY0 (rnd);   { (x1+x2)/2 }
             MX0 = MR1;                    { x3=(x1+x2)/2;           }

{ if sign(x3^2-x)<>sign(x1^2-x), }
             AY1 = SR0;              { Assign AY1 = x              }

MY1 = MX0;              { AX1 = sign(MX0^2-AY1)       }
             MR  = MX0 * MY1 (rnd);{ (x3)^2 }
             AR  = MR1 - AY1;        { (x3)^2 - x }
             AR  = 0;
             if LT AR = AF + 1;      { if (x3)^2 - x neg, AX1 = 1 }
             AX1 = AR;               { else AX1 = 0              }

MX1 = AX0;              { AY1 = sign(AX0^2-AY1)      }
             MY1 = AX0;
             MR  = MX1 * MY1 (rnd);{ (x1)^2 }
             AR  = MR1 - AY1;        { (x1)^2 - x ; Release AY1 }
             AR  = 0;
             if LT AR = AF + 1;      { if (x1)^2 - x neg, AY1 = 1 }
             AY1 = AR;               { else AY1 = 0              }

AR  = AX1 - AY1;        { if AX1 = AY1              }
             if NE jump X2GetsX3;
X1GetsX3:    AX0 = MX0;              { then x1 = x3              }
             jump EndSqrtLoop;
X2GetsX3:    AY0 = MX0;              { else x2 = x3              }
EndSqrtLoop: nop;
             jump SqrtLoop;
SqrtDone:    SR1 = MX0;
             rts;
```

```
.MODULE/ROM   Arctan_Approximation;
{
        Arctangent Approximation
                y = Arctan(x)

Calling Parameters
                MR1 = Integer part of x
                MR0 = Fractional part of x
                M1 = 1
                L3 = 0

Return Values
                AR = Arctan(x) in 1.15 scaled format
                (-0.5 for -90 degrees, 0.5 for 90 degrees)

Altered Registers
                AX0,AX1,AY0,AY1,AR,AF,MY0,MY1,MX1,MF,MR,SR,SI

Computation Time
                58 cycles (maximum)
}

.VAR/DM/RAM    atn_coeff[5];

.INIT    atn_coeff : H#28BD, H#006D, H#EF3E, H#08C6, H#FED4;

.ENTRY   arctan;

arctan:  I3 = ^atn_coeff;              {Point to coefficients}
         AY0=0;
         AX1=MR1;
         AR=PASS MR1;
         IF GE JUMP posi;              {Check for positive input}
         AR=-MR0;                      {Make negative number positive}
         MR0=AR;
         AR=AY0-MR1+C-1;
         MR1=AR;
posi:    SR=LSHIFT MR0 BY -1 (LO);     {Produce 1.15 value in SR0}
         AR=SR0;
         AY1=MR1;
         AF=PASS MR1;
         IF EQ JUMP noinv;             {If input < 1, no need to invert}
         SE=EXP MR1 (HI);              {Invert input}
         SR=NORM MR1 (HI);
         SR=SR OR NORM MR0 (LO);
         AX0=SR1;
         SI=H#0001;
         SR=NORM SI (HI);
         AY1=SR1;
         AY0=SR0;
         DIVS AY1,AX0;
         DIVQ AX0; DIVQ AX0; DIVQ AX0;
         DIVQ AX0; DIVQ AX0; DIVQ AX0;
         DIVQ AX0; DIVQ AX0; DIVQ AX0;
         DIVQ AX0; DIVQ AX0; DIVQ AX0;
         DIVQ AX0; DIVQ AX0; DIVQ AX0;
         AR=AY0;
noinv:   MY0=AR;
         MF=AR*MY0 (RND), MY1=DM(I3,M1);
         MR=AR*MY1 (SS), MX1=DM(I3,M1);
         CNTR=3;
         DO ApproxArctan UNTIL CE;
                 MR=MR+MX1*MF (SS), MX1=DM(I3,M1);
ApproxArctan:    MF=AR*MF (RND);
         MR=MR+MX1*MF (SS);
         AR=MR1;
         AY0=H#4000;
         AF=PASS AY1;
         IF NE AR=AY0-MR1;
         AF=PASS AX1;
         IF LT AR=-AR;
```

```
            RTS;
.ENDMOD;
```

What is claimed is:

1. A gimbal system, comprising:
   instrumentation mounted on a gimbal;
   control circuitry for controlling said instrumentation;
   a resolver for measuring parameters of an angle of rotation of said instrumentation as said instrumentation rotates on said gimbal, said resolver outputting said measured parameters as analog output parameter signals, along with an analog reference signal;
   multiplexor means for multiplexing said parameter and reference signals;
   an analog to digital converter, coupled to the multiplexor means, for converting said parameter and reference signals to digital signals;
   digital processing means for performing system computations based on data collected from said instrumentation, said digital processing means including:
   a) filter means for receiving said signals from said multiplexor means and for filtering said signals, said filter means further comprising a pre-filter and a post-filter means thereby reducing unwanted noise and signal sensitivity;
   b) computing means for digitally computing a value for said angle of rotation of the instrumentation from the signals from said filter means; and
   c) means for coupling said computed angle of rotation value to said control circuitry;
   wherein said system minimizes hardware component requirements.

2. The system of claim 1, wherein said computing means is programmed to perform fast Fourier transform calculations using said parameter and reference signals to compute said angle of rotation value.

3. The system of claim 1, wherein said computing means comprises:
   means for computing a magnitude value of said angle of rotation from said parameter and reference signals;
   means for computing quadrant and resulting sign values of said angle of rotation from said parameter and reference signals; and
   means for computing quadrature voltage values for said parameter and reference signals.

4. The system of claim 1, wherein said parameter and reference signals from said resolver comprise differential signals.

5. The system of claim 4, further comprising means for converting said differential signals from said resolver to single-ended signals before said signals are input into said multiplexor means.

6. The system of claim 1, further comprising digital post-filtering means for post-filtering said computed value of said angle of rotation, before said computed value is coupled to the control circuitry.

7. The system of claim 6, wherein said post-filtering means comprises an averaging block.

8. The system of claim 6, wherein said post-filtering means comprises a digital low pass filter.

9. A gimbal system, comprising:
   instrumentation mounted on a gimbal;
   control circuitry, for controlling said instrumentation;
   a resolver for measuring parameters of an angle of rotation of said instrumentation as said instrumentation rotates on said gimbal, said resolver outputting said measured parameters as analog output parameter signals, along with an analog reference signal;
   multiplexor means for multiplexing said parameter and reference signals;
   an analog to digital converter, coupled to the multiplexor means, for converting said parameter and reference signals to digital signals;
   digital processing means for performing system computations based on data collected from said instrumentation, said digital processing means including:
   a) filter means for receiving said signals from said multiplexor means and for filtering said signals, thereby reducing unwanted noise and signal sensitivity, wherein said filter means comprises means for implementing a Hanning window;
   b) computing means for digitally computing a value for said angle of rotation of the instrumentation from the signals from said filter means; and
   c) means for coupling said computed angle of rotation value to said control circuitry;
   wherein said system minimizes hardware component requirements.

10. A gimbal system, comprising:
    instrumentation mounted on a gimbal;
    control circuitry for controlling said instrumentation:
    a resolver for measuring parameters of an angle of rotation of said instrumentation as said instrumentation rotates on said gimbal, said resolver outputting said measured parameters as analog output parameter signals, along with an analog reference signal;
    multiplexor means for multiplexing said parameter and reference signals;
    an analog to digital converter, coupled to the multiplexor means for converting said parameter and reference signals to digital signals;
    digital processing means for performing system computations based on data collected from said instrumentation, said digital processing means including:
    a) filter means for receiving said signals from said multiplexor means and for filtering said signals, thereby reducing unwanted noise and signal sensitivity wherein said filter means comprises means for implementing a Blackman window;
    b) computing means for digitally computing a value for said angle of rotation of the instrumentation from the signals from said filter means: and
    c) means for coupling said computed angle of rotation value to said control circuitry;
    wherein said system minimizes hardware component requirements.

11. A gimbal system, comprising:
    instrumentation mounted on a gimbal;
    control circuitry for controlling said instrumentation;
    a resolver for measuring parameters of an angle of rotation of said instrumentation as said instrumentation rotates on said gimbal, said resolver outputting said measured parameters as analog output parameter signals, along with an analog reference signal;
    multiplexor means for multiplexing said parameter and reference signals;
    an analog to digital converter, coupled to the multiplexor means, for converting said parameter and reference signals to digital signals;
    digital processing means for performing system computations based on data collected from said instrumentation, said digital processing means including:

a) filter means for receiving said signals from said multiplexor means and for filtering said signals, thereby reducing unwanted noise and signal sensitivity wherein said filter means comprises means for implementing a Blackman window;

b) computing means for digitally computing a value for said angle of rotation of the instrumentation from the signals from said filter means; and c) means for coupling said computed angle of rotation value to said control circuitry;

wherein said system minimizes hardware component requirements.

12. The system of claim 1, further comprising an amplifier for scaling said parameter and reference signals.

13. A method for determining the angle of rotation of gimbal mounted instrumentation in a gimbal system having control circuitry for controlling said instrumentation, comprising the steps of:

a) receiving signals from said instrumentation;

b) measuring parameters of said angle of rotation from said received signals;

c) outputting said parameters as analog signals along with an analog reference signal;

d) converting said signals from differential signals to single ended signals;

e) multiplexing said signals;

f) converting said analog signals to digital signals;

g) pre-filtering and post-filtering said multiplexed, single ended digital signals to reduce noise and signal sensitivity;

h) digitally computing an angle of rotation value from said digital signals; and i) outputting said computed value for said angle of rotation to said control circuitry controlling said instrumentation.

14. The method of claim 13, wherein said step b) comprises determining sine and cosine values for said angle of rotation.

15. The method of claim 13, wherein said step h) value comprises:

computing a magnitude value for said angle of rotation;

computing quadrant and resulting sign values of said angle of rotation;

computing quadrature voltage values associated with said angle of rotation parameters; and digitally post-filtering signals representing said angle of rotation before outputting said signals to said control circuitry to reduce noise associated with said signal.

16. A gimbal system, comprising:

instrumentation mounted on a gimbal;

control circuitry for controlling said instrumentation;

a resolver for measuring parameters of an angle of rotation (Θ) of said instrumentation as said instrumentation rotates on said gimbal, said resolver outputting said measured parameters as analog output parameter signals, along with an analog reference signal;

multiplexor means for multiplexing said parameter and reference signals;

an analog digital convertor coupled to the multiplexor means for converting said parameter and reference signals to digital signals;

digital processing means for performing system computations based on data collected from said instrumentation, said digital processing means including:

a) filter means for receiving said signals from the multiplexor means and for filtering said signals, thereby reducing unwanted noise and signal sensitivity;

b) computing means for digitally computing a value for the magnitude of said angle of rotation of the instrumentation through the following equation:

$$|\Theta| = \tan^{-1}\left( \sqrt{\frac{(Y_{sin}(f_{ref}))^2 - (q_s)^2}{(Y_{cos}(f_{ref}))^2 - (q_c)^2}} \right) \quad (1)$$

where $Y_{sin}$ is a sine output from said resolver, $f_{ref}$ is a reference frequency, $q_s$ is a quadrature magnitude for a sine winding of said resolver, and $q_c$ is a quadrature magnitude for a cosine winding of said resolver;

c) means for computing a quadrant of said angle of rotation by computing values from the following equations:

$$\frac{A\cos(\Theta)}{\sqrt{2}} \quad (2)$$

$$\frac{A\sin(\Theta)}{\sqrt{2}} \quad (3)$$

where A is a constant and Θ is said angle of rotation;

said angle of rotation being located in a first quadrant if computed values for equations (2) and (3) are positive, said angle of rotation being located in a second quadrant if said computed value of equation (2) is negative and said computed value of equation (3) is positive, said angle of rotation being located in a third quadrant if said computed values of equations (2) and (3) are negative, said angle of rotation being located in a fourth quadrant if said computed value of equation (2) is positive and said computed value of equation (3) is negative;

d) means for estimating quadrature voltage values for said sine and cosine windings of said resolver by detecting a voltage associated with said instrumentation as said instrumentation rotates through a zero degree reference point of said resolver, and then subtracting said estimated quadrature voltage; and e) means for outputting said system computations to said control circuitry to control said instrumentation.

* * * * *